(12) United States Patent
Mieczkowski et al.

(10) Patent No.: US 8,907,350 B2
(45) Date of Patent: Dec. 9, 2014

(54) SEMICONDUCTOR DEVICES HAVING IMPROVED ADHESION AND METHODS OF FABRICATING THE SAME

(75) Inventors: Van Mieczkowski, Apex, NC (US); Helmut Hagleitner, Zebulon, NC (US)

(73) Assignee: Cree, Inc., Durham, NC (US)

( * ) Notice: Subject to any disclaimer, the term of this patent is extended or adjusted under 35 U.S.C. 154(b) by 473 days.

(21) Appl. No.: 12/769,307

(22) Filed: Apr. 28, 2010

(65) Prior Publication Data
US 2011/0266557 A1  Nov. 3, 2011

(51) Int. Cl.
| H01L 29/15 | (2006.01) |
|---|---|
| H01L 29/778 | (2006.01) |
| H01L 29/423 | (2006.01) |
| H01L 29/66 | (2006.01) |
| H01L 29/06 | (2006.01) |
| H01L 29/20 | (2006.01) |

(52) U.S. Cl.
CPC ...... *H01L 29/7787* (2013.01); *H01L 29/42316* (2013.01); *H01L 29/66462* (2013.01); *H01L 29/0649* (2013.01); *H01L 29/2003* (2013.01)
USPC .......................................................... 257/77

(58) Field of Classification Search
CPC ..................... H01L 29/42316; H01L 29/1608; H01L 29/66068; H01L 29/1602; H01L 29/7802; H01L 12/6606
USPC ............................ 257/194, 192, 472, 486, 77
See application file for complete search history.

(56) References Cited

U.S. PATENT DOCUMENTS

| 5,300,795 | A | * | 4/1994 | Saunier et al. | 257/192 |
| 5,365,078 | A | * | 11/1994 | Hayashi et al. | 257/24 |
| 5,412,236 | A | * | 5/1995 | Ikeya et al. | 257/282 |
| 5,530,272 | A | * | 6/1996 | Kudo et al. | 257/192 |
| 2005/0023555 | A1 | * | 2/2005 | Yoshida et al. | 257/192 |

(Continued)

FOREIGN PATENT DOCUMENTS

| JP | 61160978 A | * | 7/1986 |
| JP | 03-292746 | | 12/1991 |

(Continued)

OTHER PUBLICATIONS

Khalil et al., "Improving the Linearity of GaN HEMTs by Optimizing Epitaxial Structure," IEEE Transactions on Electron Devices, vol. 56, No. 3, Mar. 2009, pp. 361-364.

(Continued)

*Primary Examiner* — Anthony Ho
(74) *Attorney, Agent, or Firm* — Myers Bigel Sibley & Sajovec, P.A.

(57) ABSTRACT

Wide bandgap semiconductor devices are fabricated by providing a wide bandgap semiconductor layer, providing a plurality of recesses in the wide bandgap semiconductor layer, and providing a metal gate contact in the plurality of recesses. A protective layer may be provided on the wide bandgap semiconductor layer, the protective layer having a first opening extending therethrough, a dielectric layer may be provided on the protective layer, the dielectric layer having a second opening extending therethrough that is narrower than the first opening, and a gate contact may be provided in the first and second openings. The metal gate contact may be provided to include a barrier metal layer in the plurality of recesses, and a current spreading layer on the barrier metal layer remote from the wide bandgap semiconductor layer. Related devices and fabrication methods are also discussed.

34 Claims, 14 Drawing Sheets

(56) References Cited

U.S. PATENT DOCUMENTS

| | | | |
|---|---|---|---|
| 2006/0038182 A1 | 2/2006 | Rogers et al. | |
| 2006/0054925 A1* | 3/2006 | Kikkawa | 257/192 |
| 2008/0217625 A1* | 9/2008 | Kuroda et al. | 257/76 |
| 2009/0159930 A1 | 6/2009 | Smorchkova et al. | |
| 2009/0224288 A1 | 9/2009 | Parikh et al. | |
| 2009/0283756 A1 | 11/2009 | Hellings et al. | |

FOREIGN PATENT DOCUMENTS

| | | |
|---|---|---|
| JP | H03-292746 A | 12/1991 |
| JP | 2006-253559 | 9/2006 |
| JP | 2008518462 A | 5/2008 |
| JP | 2008-227014 | 9/2008 |

OTHER PUBLICATIONS

Cheng et al., "Broadband Microwave Noise Characteristics of High-Linearity Composite-Channel $Al_{0.3}Ga_{0.7}N/Al_{0.05}Ga_{0.95}N/GaN$ HEMTS," IEEE Electron Device Letters, vol. 26, No. 8, Aug. 2005,-pp. 521-523.

Wu et al., "30-W/mm GaN HEMTs by Field Plate Optimization," IEEE Electron Device Letters, vol. 25, No. 3, Mar. 2004, pp. 117-119.

Williams, Ralph E., "Gallium Arsenide Processing Techniques," 1984, Chapters 12 and 13, pp. 259-301.

International Search Report and the Written Opinion of the International Searching Authority Corresponding to International Application No. PCT/US2011/033562; Date of Mailing: Jul. 7, 2011; 11 Pages.

Notification Concerning Transmittal of International Preliminary Report on Patentability of the International Searching Authority Corresponding to International Application No. PCT/US2011/033562; Date of Mailing: Nov. 8, 2012; 9 Pages.

Japanese Office Action corresponding to Japanese Patent Application No. 2013-50811, mailing date Mar. 26, 2014, 5 pages, English Translation 5 pages.

Extended European Search Report corresponding to European Patent Application No. 11775463.0, mailing date Aug. 1, 2014, 16 pages.

* cited by examiner

US 8,907,350 B2

SEMICONDUCTOR DEVICES HAVING IMPROVED ADHESION AND METHODS OF FABRICATING THE SAME

BACKGROUND

This invention relates to semiconductor devices and, more particularly, to semiconductor devices, including wide bandgap semiconductor devices, having improved contacts and methods of fabricating the same.

Semiconductor materials such as silicon (Si), gallium nitride (GaN), and gallium arsenide (GaAs) have found wide application in semiconductor devices for consumer, commercial and other applications. A device of particular interest for high power and/or high frequency applications is the High Electron Mobility Transistor (HEMT). A HEMT is a field effect transistor (FET) that incorporates a junction between two materials with different bandgaps (i.e., a heterojunction) as the channel, instead of a doped region, as is generally the case in integrated circuit field effect transistors. A Schottky barrier gate is used to control a two-dimensional electron gas (2DEG) between a source region and a drain region. A Schottky barrier is a potential barrier formed at a metal-semiconductor junction, which has rectifying characteristics.

Wide bandgap HEMT and FET devices generally include a wide bandgap semiconductor layer and a gate electrode on a planar surface of the wide bandgap semiconductor layer. A gate contact may be provided that is electrically connected to the gate electrode that is used to supply a voltage to the gate electrode. The gate contact may be formed outside the active area of the device, and may be formed integrally with the gate electrode. Both the gate electrode and the gate contact typically each include three metal layers: a barrier metal layer in contact with the wide bandgap semiconductor, a current spreading layer, and a diffusion barrier layer therebetween to reduce or prevent diffusion of the current spreading layer into the metal layer. For example, nickel is the most commonly used barrier metal layer for GaN-based HEMTs. The current spreading layer is typically gold and the diffusion barrier layer is typically platinum. The gold current spreading layer serves to enhance the conductivity of the gate electrode and to lower gate electrode resistance. The platinum diffusion barrier layer is used as a barrier for gold diffusion, which, if allowed to reach the semiconductor surface, may create a degraded Schottky contact.

One step in the fabrication of such wide bandgap devices is the formation of the gate electrode. Conventional methods of gate electrode formation may include depositing a dielectric on the wide band gap semiconductor, etching through the dielectric using a mask and/or other sacrificial layer to expose a planar surface of the underlying wide band gap semiconductor, and depositing the metal layers in a T-shape (when viewed from the top) onto the exposed planar surface of the wide band gap semiconductor thereby forming the gate electrode and the gate contact (referred to as a "T-gate"). Other conventional methods of gate electrode formation include depositing a dielectric on the wide bandgap semiconductor, etching through the dielectric using a mask and/or other sacrificial layer to expose a planar surface of the underlying wide bandgap semiconductor, and removing the mask and/or other sacrificial layer from the dielectric prior to formation of the gate electrode. As such, the gate electrode may completely fill the etched portion of the dielectric, and "wings" or sidelobes of the gate electrode may be formed directly on the dielectric surface. Such a gate electrode is often referred to as a "gamma" gate.

SUMMARY

Wide bandgap semiconductor devices according to various embodiments described herein include a wide bandgap semiconductor layer having a top surface, a plurality of recesses in the top surface of the wide bandgap semiconductor layer, and a metal gate contact within the recesses and on portions of the top surface of the wide bandgap semiconductor layer that are between the recesses. In some embodiments, a protective layer is on the wide bandgap semiconductor layer, a first opening extending through the protective layer, a dielectric layer is on the protective layer, the dielectric layer having a second opening extending therethrough that is narrower than the first opening, and a metal gate contact is in the first and second openings. In some embodiments, the protective layer has flanges laterally extending into the first opening.

In some embodiments, the metal gate contact includes a barrier metal layer within the recesses and directly on the top surface of the side bandgap semiconductor layer that are between the recesses, and a current spreading layer on the barrier metal layer remote from the wide bandgap semiconductor layer. Moreover, in some embodiments, the current spreading layer is directly on the barrier metal layer.

As to materials, in some embodiments, the wide bandgap semiconductor layer comprises gallium nitride or gallium arsenide, the barrier metal layer comprises platinum, iridium and/or nickel, and the current spreading layer comprises gold. In other embodiments, the wide bandgap semiconductor layer comprises silicon carbide, the barrier metal layer comprises platinum, gold or iridium, and the current spreading layer comprises gold.

The plurality of recesses may be provided in a variety of arrangements according to other embodiments. For example, in some embodiments, the plurality of recesses are arranged in a two-dimensional array. In other embodiments, the plurality of recesses are arranged in at least a first row and at least a second row, wherein the recesses of the first row are offset in at least two directions from the recesses of the second row. In other embodiments, the plurality of recesses form at least two grooves, the at least two grooves defining a ridge between the at least two grooves. In still other embodiments, the plurality of recesses are arranged in a random pattern.

In some embodiments, source and drain regions also are provided, a metal gate electrode is on the wide bandgap semiconductor layer between the source and drain regions, the metal gate electrode having a first end and an opposing end, wherein the metal gate contact is connected to the opposing end of the metal gate electrode, and wherein the source and drain regions and the metal gate electrode are configured to provide a HEMT, FET or Schottky device.

Wide bandgap semiconductor devices according to various further embodiments described herein include a wide bandgap semiconductor layer, protective layer on the wide bandgap semiconductor layer, wherein a plurality of recesses extend through the protective layer to the wide bandgap semiconductor layer, a plurality of spacers comprising a dielectric material, the plurality of spacers arranged between the plurality of recesses, and a metal gate contact within the recesses and directly on the spacers that are between the recesses In some embodiments the plurality of spacers comprise portions of the protective layer. In some embodiments, the protective layer has an opening extending therethrough, and wherein the protective layer has flanges laterally extending into the opening.

The plurality of spacers may be provided in a variety of arrangements according to other embodiments. For example, in some embodiments, the plurality of spacers are arranged in a two-dimensional array. In other embodiments, the plurality of spacers are arranged in at least a first row and at least a second row, wherein the spacers of the first row are offset in at least two directions from the spacers of the second row. In other embodiments, the plurality of spacers form at least two ridges, the at least two ridges defining a groove between the at least two ridges. In still other embodiments, the plurality of spacers are arranged in a random pattern.

Semiconductor devices according to various further embodiments described herein include a substrate, a wide bandgap semiconductor layer on the substrate, the wide bandgap semiconductor layer having source and drain regions and having a top surface, a metal gate electrode on the top surface of the side bandgap semiconductor layer between the source and drain regions, the metal gate electrode having a first end and an opposing end, and a metal gate contact connected to the opposing end of the gate electrode on the top surface of the side bandgap semiconductor layer, wherein a plurality of recesses are provided in the top surface of the wide bandgap semiconductor layer, and wherein the metal gate contact is within the recesses and directly on portions of the top surface of the wide bandgap semiconductor layer that are between the recesses.

Methods of fabricating wide bandgap semiconductor devices according to various embodiments described herein may include providing a wide bandgap semiconductor layer having a top surface, providing a plurality of recesses in the top surface of the wide bandgap semiconductor layer, and providing a metal gate contact within the plurality of recesses and directly on portions of the top surface of the wide bandgap semiconductor layer that are between the recesses. In some embodiments, a protective layer may be provided on the wide bandgap semiconductor layer, the protective layer having a first opening extending therethrough, a dielectric layer may be provided on the protective layer, the dielectric layer having a second opening extending therethrough that is narrower than the first opening, and a metal gate contact may be provided in the first and second openings.

In some embodiments, the gate contact may be provided to include a barrier metal layer within the plurality of recesses and directly on portions of the top surface of the wide bandgap semiconductor layer between the recesses, and a current spreading layer may be provided on the barrier metal layer remote from the wide bandgap semiconductor layer. In other embodiments, the current spreading layer may be provided directly on the barrier metal layer.

In some embodiments, source and drain regions may be provided, and a metal gate electrode may be provided on the wide bandgap semiconductor layer between the source and drain regions, the metal gate electrode having a first end and an opposing end and wherein the gate contact is connected to the opposing end of the gate electrode.

Various embodiments described herein may also be regarded as providing a barrier metal layer comprising platinum, iridium or gold and configured to prevent a substantial increase in leakage current of the metal gate electrode.

DETAILED DESCRIPTION

Figure 1:
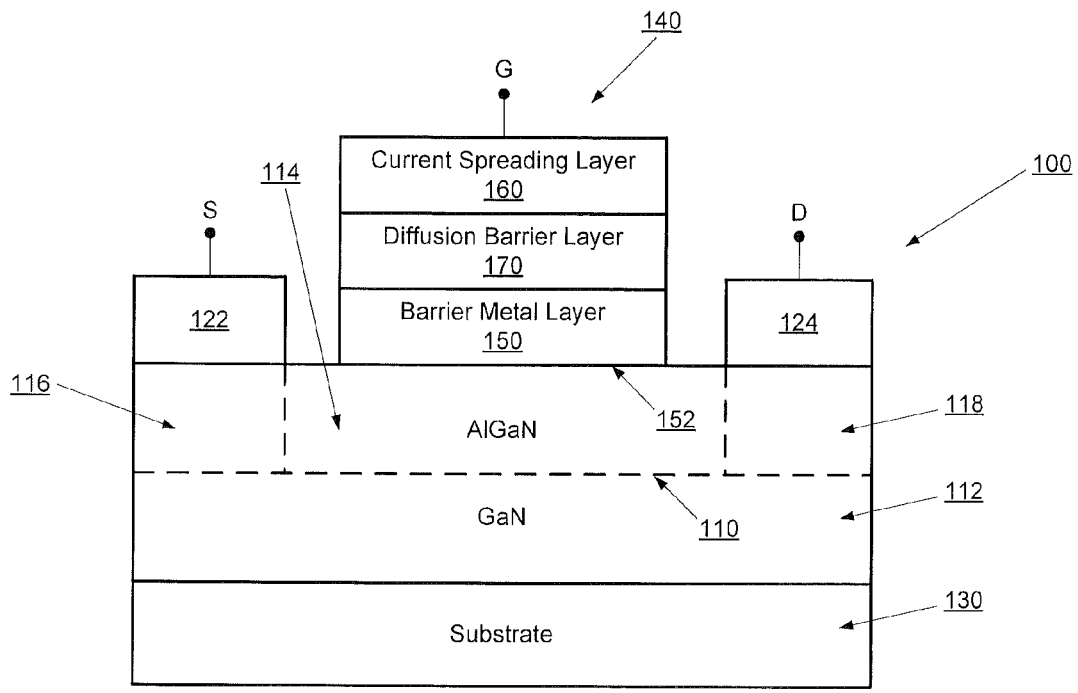
FIG. 1 is a cross-sectional view of a conventional GaN-based HEMT.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises", "comprising", "includes" and/or "including" (and variants thereof), when used in this specification, specify the presence of stated features, steps, operations, elements, and/or components, but do not preclude the presence or addition of one or more other features, steps, operations, elements, components, and/or groups thereof. For example, when a layer is indicated as "comprising" a given material, the layer may include additional materials to form binary, ternary, quaternary etc., compounds, alloys, doped layers, etc. Thus, for example, a layer that comprises gallium nitride includes a layer of aluminum gallium nitride, indium gallium nitride and/or aluminum indium gallium nitride. In contrast, the term "consisting of" (and variants thereof) when used in this specification, specifies the stated features, steps, operations, elements, and/or components, and precludes additional features, steps, operations, elements and/or components. Finally, all of the above defined terms do not preclude the layer from being doped P-type and/or N-type using appropriate dopants.

It will be understood that when an element such as a layer, region or substrate is referred to as, being "on" another element (and variants thereof), it can be directly on the other element or intervening elements may also be present. Furthermore, relative terms such as "beneath", "overlies", "topside" and "backside" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Various embodiments of wide bandgap semiconductor devices will be described herein. As used herein, the term "wide bandgap" means a bandgap of at least 1.4 electron volts. As used herein, the term "semiconductor device" means a HEMT, FET, bipolar junction transistor (BJT), silicon carbide monolithic integrated circuits and/or other device that includes a Schottky junction between a metal layer in a contact and a wide bandgap semiconductor material, which may include silicon carbide, gallium nitride, gallium arsenide and/or other semiconductor materials.

Figure 2:
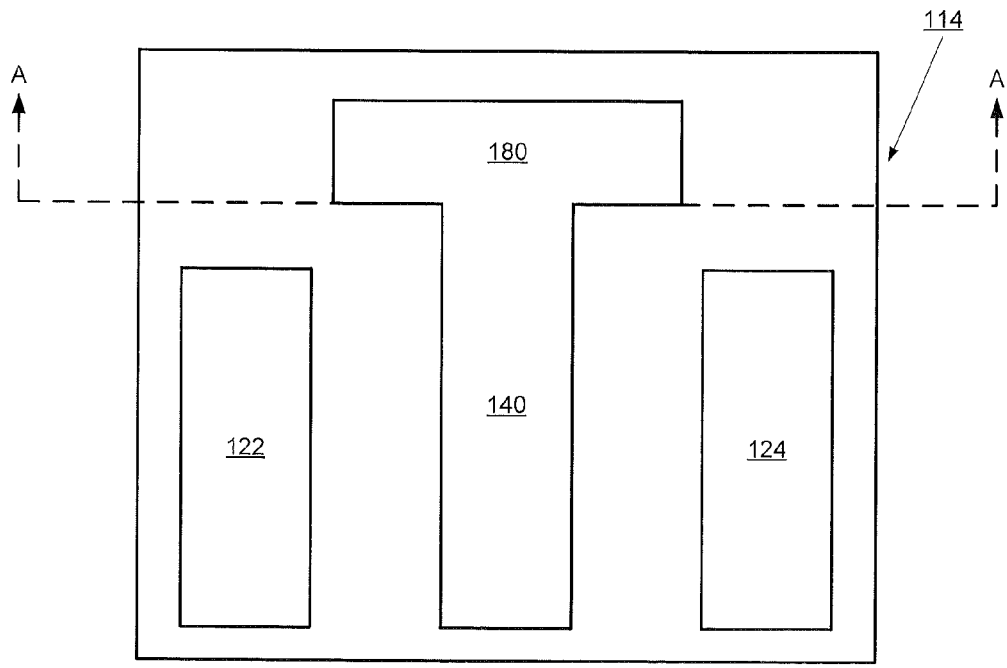
FIG. 2 is a plan view of the GaN-based HEMT in FIG. 1.
Figure 3:
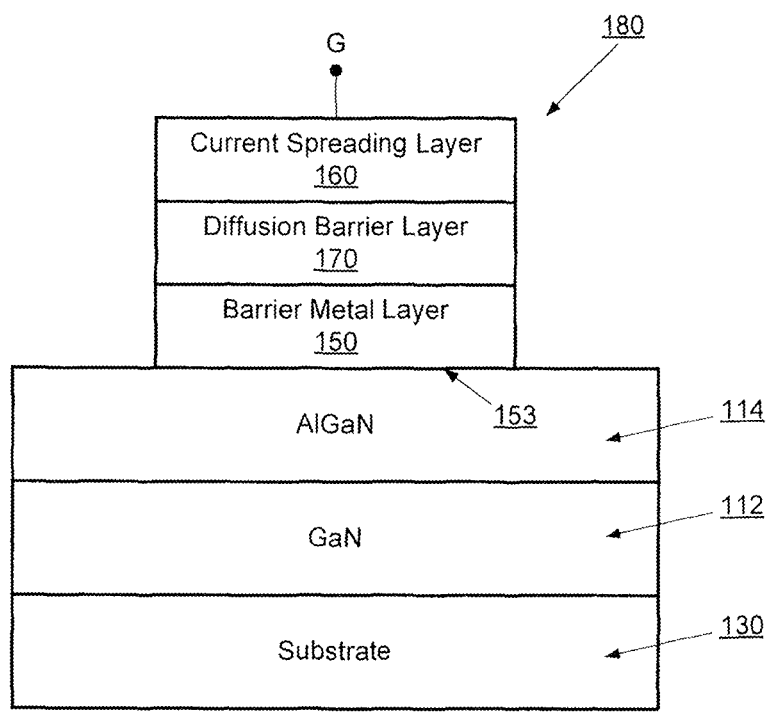
FIG. 3 is a sectional view of taken along the line A-A of FIG. 2.

FIGS. 1, 2 and 3 show a conventional GaN-based HEMT structure 100. HEMT 100 may include a heterojunction 110 between two different wide bandgap semiconductor materials 112 and 114 having different bandgaps. In FIGS. 1-3, the two different materials 112 and 114 comprise GaN and AlGaN, respectively, but other materials may be used in other embodiments. A source region 116 and a drain region 118 may be provided. Source and drain contacts 122 and 124, respectively, may also be provided. A substrate 130 also may be provided. Various other buffer, spacer, capping and/or other layers may be provided. A gate electrode 140 may be provided. The gate electrode 140 may include a barrier metal layer 150 on the wide bandgap semiconductor layer 114 that forms a Schottky junction 152 therewith. A current spreading layer 160 is provided on the barrier metal layer 150, remote from the wide bandgap semiconductor layer 114. A diffusion barrier layer 170 is provided between the current spreading layer 160 and the barrier metal layer 150.

FIG. 2 is a plan view of the conventional HEMT of FIG. 1, and shows that the gate electrode 140 includes a gate contact 180 that is located outside the HEMT active region. A gate voltage may be applied to the gate contact region 180. FIG. 3 is a sectional view taken along the line A-A of FIG. 2. Referring to FIG. 3, the gate contact 180 is provided on a planar surface of the wide bandgap semiconductor layer 114. The gate contact 180 includes a barrier metal layer 150 on the planar surface of the wide bandgap semiconductor layer 114 that forms a passive junction 153 therewith. Current spreading layer 160 is provided on the barrier metal layer 150, remote from the wide bandgap semiconductor layer 114. Diffusion barrier layer 170 is provided between the current spreading layer 160 and the barrier metal layer 150.

Unfortunately, there may be poor adhesion between the barrier metal layer in the contact region of the gate electrode and the planar surface of the wide bandgap semiconductor. Such poor adhesion may result in the loss of the gate contact during the fabrication or use of the wide bandgap semiconductor device. In addition, in a conventional wide bandgap semiconductor device, for example a GaN-based HEMT device, some high work function metals that would improve the electrical properties of the gate electrode are difficult to use as the barrier metal layer of the gate due to poor adhesion between such metals and wide bandgap semiconductor material. Such high work function metals include, for example, platinum (Pt) and iridium (Ir).

Figure 4:
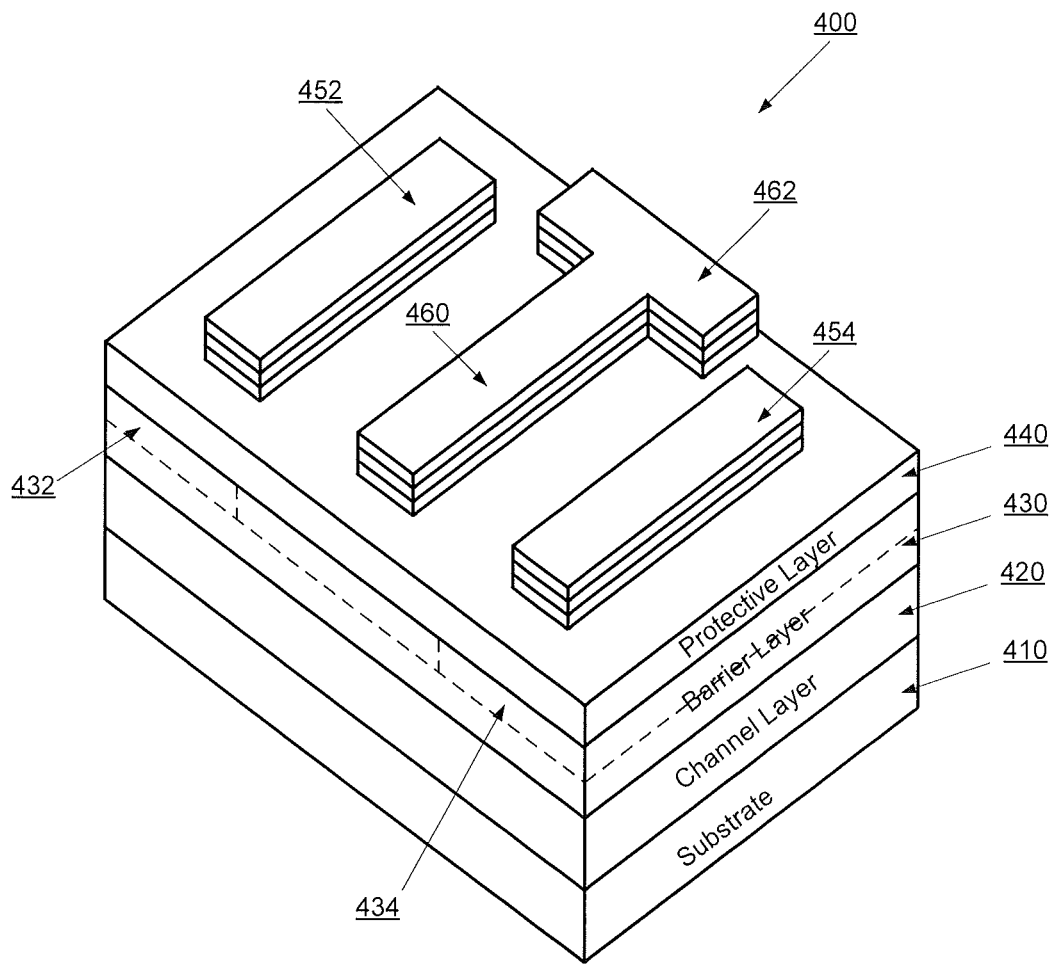
FIG. 4 is a perspective view of a wide bandgap semiconductor device according to exemplary embodiments of the present invention.
Figure 5:
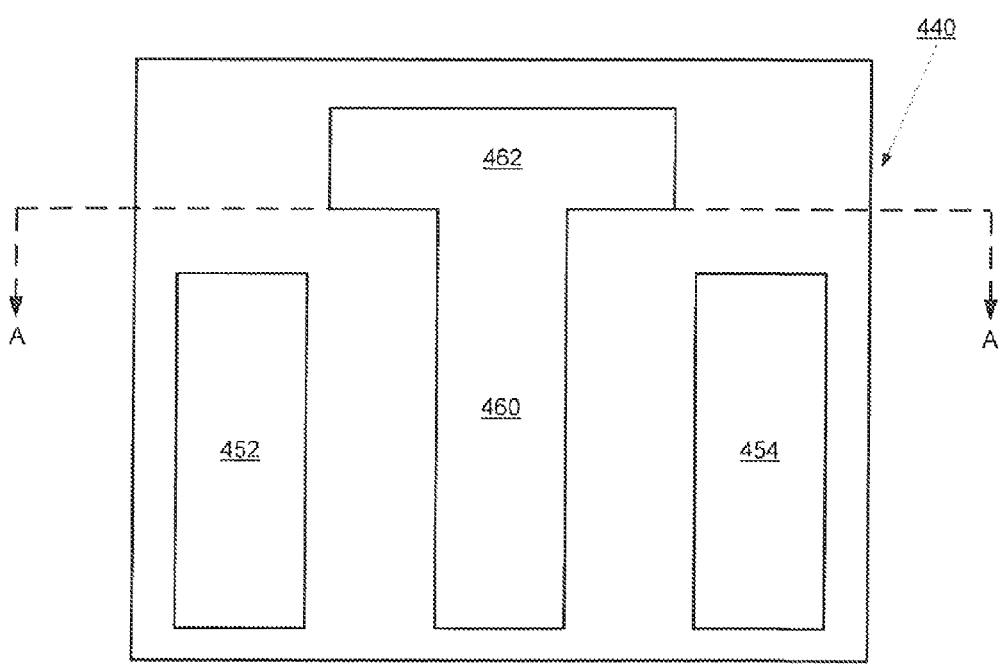
FIG. 5 is a plan view of the device of FIG. 4.
Figure 6:
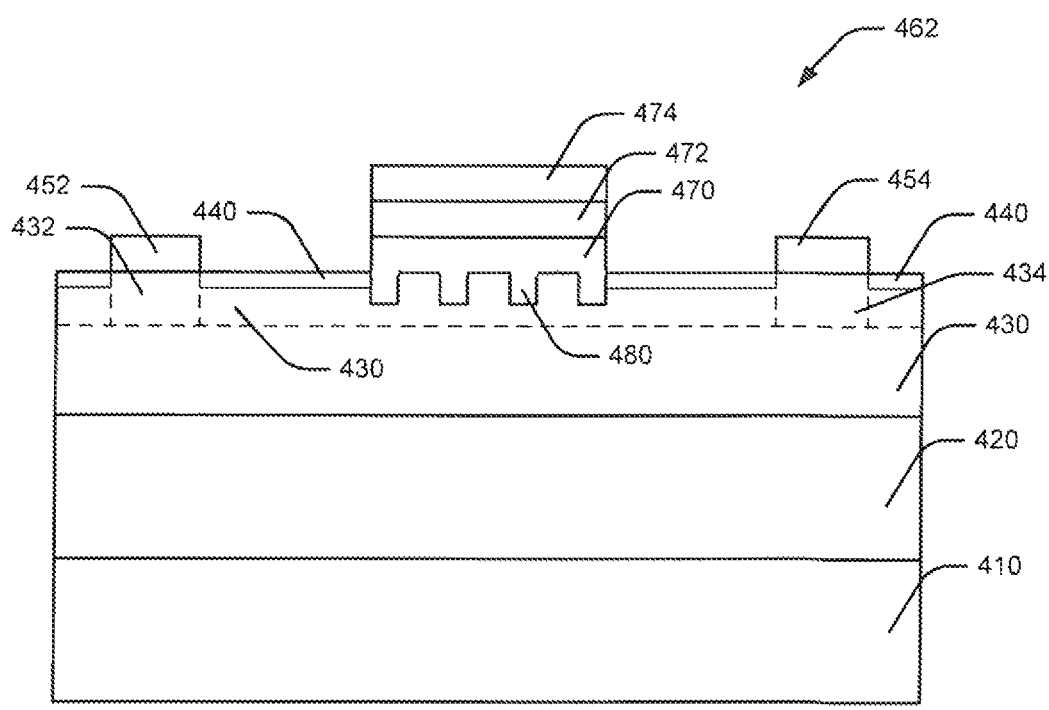
FIG. 6 is a sectional view taken along the section line A-A of FIG. 5.

FIGS. 4-6 are simplified illustrations of a wide bandgap semiconductor device having an improved metal contact according to various embodiments of the present invention.

Referring now to FIGS. 4-6, an exemplary wide bandgap semiconductor device 400 includes a substrate 410 that may be, for example, a semi-insulating silicon carbide (SiC) substrate such as, the 4H polytype of silicon carbide. Other silicon carbide candidate polytypes may include the 3C, 6H, and 15R polytypes. The term "semi-insulating" is used descriptively herein, rather than in an absolute sense.

It is to be understood that, although silicon carbide may be employed as a substrate, embodiments of the present invention may utilize any suitable substrate for the substrate 410, such as sapphire ($Al_2O_3$), aluminum nitride (AlN), aluminum gallium nitride (AlGaN), gallium nitride (GaN), silicon (Si), gallium arsenide (GaAs), LGO, zinc oxide (ZnO), LAO, indium phosphide (InP), and the like. It will also be appreciated that the substrate may later be removed.

Optional buffer, nucleation and/or transition layers (not shown) may also be provided on the substrate 410. For example, an AlN buffer layer may be provided to provide an appropriate crystal structure transition between a silicon carbide substrate and the remainder of the device.

Still referring to FIGS. 4-6, a channel layer 420 is provided on the substrate 410. The channel layer 420 may be deposited on the substrate 410 using buffer layers, transition layers, and/or nucleation layers as described above. The channel layer 420 may be under compressive strain. In some embodiments of the present invention, the channel layer 420 may be a Group III-nitride layer, such as GaN. The channel layer 420 may also include other Group III-nitride layers, such as indium gallium nitride (InGaN), aluminum indium gallium nitride (AlInGaN), or the like. In some embodiments, the channel layer 420 may be undoped (i.e., "unintentionally doped"), and may be grown to a thickness of greater than about 20 Å. The channel layer 420 may also be a multi-layer structure, such as a superlattice or combinations of GaN, AlGaN, or the like.

As further shown in FIGS. 4-6, a barrier layer 430 is provided on the channel layer 420. The barrier layer 430 may be a Group III-nitride layer, such as $Al_xGa_{1-x}N$ (where $0<x<1$). The barrier layer 430 may also include other Group III-nitride layers, such as AlInGaN, AlN, and/or combinations of layers thereof. The barrier layer 430 may, for example, be from about 0.1 nm to about 100 nm thick, but may not be so thick as to cause cracking or substantial defect formation therein.

The barrier layer 430 may be a highly-doped n-type layer. For example, the barrier layer 430 may be doped to a concentration of less than about $10^{19}$ cm$^{-3}$.

Some embodiments of the present invention may be applicable in high electron mobility transistors (HEMTs). More particularly, the channel layer 420 and the barrier layer 430 may be formed of materials having different bandgaps, such that an interface between the channel layer and the barrier layer defines a heterojunction. For example, the channel layer 420 may have a bandgap that is less than the bandgap of the barrier layer 430. As such, the energy of the conduction band edge of the channel layer 420 may be less than the energy of the conduction band edge of the barrier layer 430 at the junction between the channel 420 and barrier 430 layers, and the channel layer 420 may have a greater electron affinity than the barrier layer 430. For example, where both the channel layer 420 and the barrier layer 430 are formed of Group III-nitride layers, the channel layer 420 may be a GaN layer, and the barrier layer 430 may be an AlGaN layer.

Still referring to FIGS. 4-6, a protective layer 440 is provided on the barrier layer 430. The protective layer 440 may be dielectric material, such as silicon nitride ($Si_xN_y$), aluminum nitride (AlN), silicon dioxide ($SiO_2$), and/or other suitable protective material. Other materials may also be utilized for the protective layer 440. For example, the protective layer 440 may also include magnesium oxide, scandium oxide, aluminum oxide and/or aluminum oxynitride. Furthermore, the protective layer 440 may be a single layer or may include multiple layers of uniform and/or non-uniform composition. The protective layer 440 may have a thickness of about 30 nm, however, layers of other thicknesses may also be utilized. For example, the protective layer 440 may be sufficiently thick so as to protect the underlying barrier layer 430 during a subsequent anneal of ohmic contacts. Protective layers 440 as thin as two or three monolayers may be sufficient for such purposes. However, in general, the protective layer 440 may have a thickness of from about 10 nm to about 500 nm. In some embodiments, the protective layer 440 may be a high quality SiN layer that is grown in-situ with the MOCVD growth of the underlying group III nitride layers.

As further shown in FIGS. 4-6, a source region 432 and a drain region 434 may be provided. Source and drain ohmic contacts 452 and 454, respectively, are provided on the source region 432 and the drain region 434 of the barrier layer 430. A gate electrode 460 and gate contact 462 also are provided on the barrier layer 430. More particularly, the gate electrode 460 is provided on the barrier layer 430, and the gate contact 462 is provided on a plurality of recesses 480 (see FIG. 6) on or in the barrier layer 430. The gate electrode 460 and gate contact 462 may include a barrier metal layer 470. The barrier metal layer 470 of the gate electrode 460 is provided on the barrier layer 430. The barrier metal layer 470 of the gate contact 462 is provided on the plurality of recesses in the barrier layer 430. A current spreading layer 474 is provided on the barrier metal layer 470, remote from the barrier layer 430. A diffusion barrier layer 472 may be provided between the current spreading layer 474 and the barrier metal layer 470. Various embodiments of forming the gate electrode 460 and the gate contact 462 will be described below.

It has been found, in a conventional GaN-based HEMT device, that a metal gate contact formed on a planar surface of a wide bandgap semiconductor can have poor adhesion between the metal of the gate contact and the planar surface of the semiconductor. In addition, in a conventional GaN-based HEMT device, it has been found that a gate electrode with a nickel barrier metal layer can degrade and become leaky. High work function metals, such as Pt and Ir that would reduce leakage current of the gate electrode are difficult to use as the barrier metal layer due to poor adhesion between such metals and wide bandgap semiconductor material.

In order to reduce or prevent this poor adhesion and difficulty in using some high work function metals, various embodiments described herein provide a plurality of recesses formed in or on the surface of the wide bandgap semiconductor to increase the adhesion between the metal gate contact and the surface of the wide bandgap semiconductor. Moreover, by increasing the adhesion between the metal of the gate contact and the surface of the wide bandgap semiconductor, high work function metals, such as Pt and Ir may be used as the barrier metal layer. When high work function metals, such as Pt or Ir, are used as the barrier metal layer, the diffusion barrier metal layer may be omitted from the gate contact. Additionally, use of such high work function metals as the barrier metal layer decreases leakage current of the gate electrode. Leakage decreases of at least an order of magnitude, for example a ten-fold decrease, are not uncommon.

Figure 7:
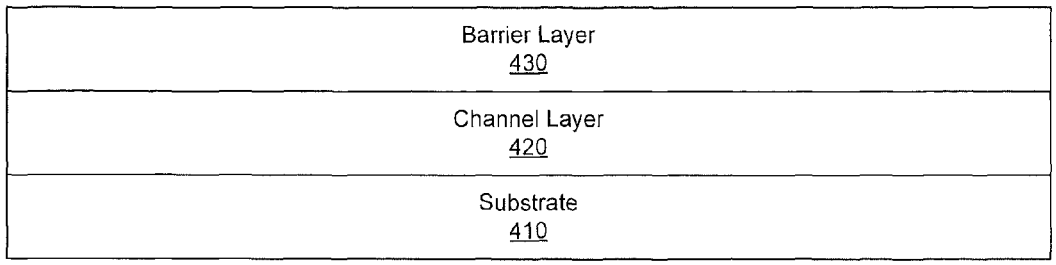
FIGS. 7-10, 12-13, 15, 17 and 22-25 are cross-sectional views illustrating exemplary intermediate fabrication steps in operations for fabricating wide bandgap semiconductor devices according to some embodiments of the present invention.

FIGS. 7-25 illustrate exemplary intermediate fabrication steps in methods for fabricating wide bandgap semiconductor devices having improved metal contacts according to some embodiments of the present invention such as the device of FIGS. 4-6. Referring now to FIG. 7, a substrate 410 is provided on which a wide bandgap semiconductor device may be formed. A channel layer 420 is formed on the substrate 410, and a barrier layer 430 is formed on the channel layer 420.

Optional buffer, nucleation and/or transition layers (not shown) may also be provided on the substrate 410. For example, an AlN buffer layer may be provided to provide an appropriate crystal structure transition between a silicon carbide substrate and the remainder of the device. The channel layer 420 and/or buffer, nucleation, and/or transition layers may be deposited by metal-organic chemical vapor deposition (MOCVD) or by other techniques known to those of skill in the art, such as molecular beam epitaxy (MBE) and/or hydride vapor phase epitaxy (HVPE).

Figure 8:
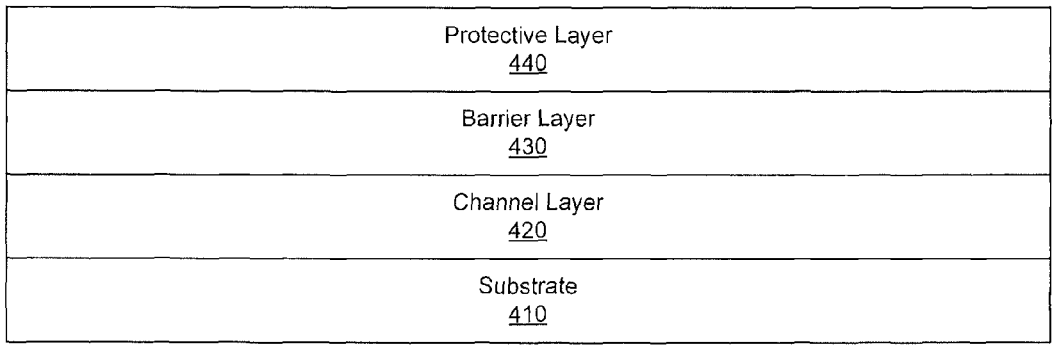

FIG. 8 illustrates formation of a protective layer 440 on the barrier layer 430. The protective layer 440 may be dielectric material, such as silicon nitride ($Si_xN_y$), aluminum nitride (AlN), silicon dioxide ($SiO_2$), and/or any other suitable protective material. Other materials may also be utilized for the protective layer 440. For example, the protective layer 440 may also include magnesium oxide, scandium oxide, aluminum oxide and/or aluminum oxynitride. Furthermore, the protective layer 440 may be a single layer or may include multiple layers of uniform and/or non-uniform composition.

The protective layer 440 may be a blanket formed on the barrier layer 430. For example, the protective layer 440 may be a silicon nitride (SiN) layer formed by high quality sputtering and/or plasma-enhanced chemical vapor deposition (PECVD). The protective layer 440 may have a thickness of about 30 nm; however, other thickness layers may also be utilized. For example, the protective layer 440 may be sufficiently thick so as to protect the underlying layer during a subsequent anneal of ohmic contacts. Layers as thin as two or three monolayers may be sufficient for such purposes. However, in general, the protective layer 440 may have a thickness of from about 10 nm to about 500 nm. Also, a high quality SiN protective layer 440 may be grown in-situ with the MOCVD growth of the underlying group III nitride layers.

Figure 9:
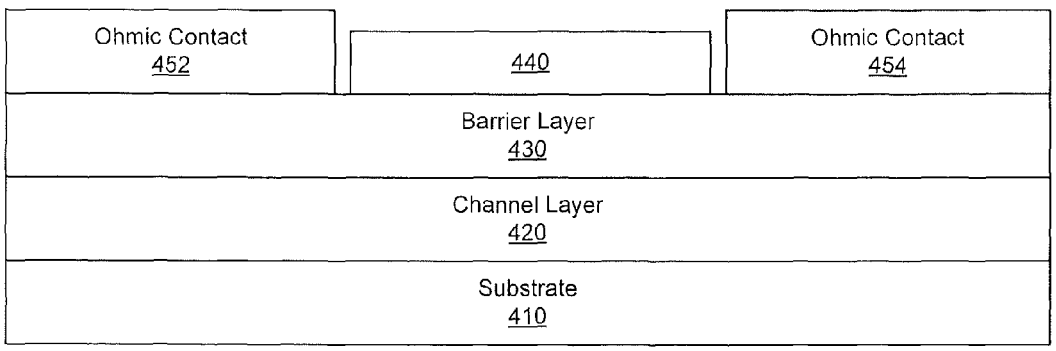

FIG. 9 illustrates formation of source and drain ohmic contacts 452 and 454, respectively, on the barrier layer 430. Referring now to FIG. 9, the protective layer 440 is patterned to expose portions of the barrier layer 430, and the source and drain ohmic contacts 452 and 454 are formed on the barrier layer 430. For example, windows may be etched into the protective layer 440 to expose the underlying barrier layer 430. The windows may be etched utilizing a patterned mask and a low-damage etch with respect to the barrier layer 430. Examples of low damage etch techniques may include etching techniques other than reactive ion etching, such as inductively coupled plasma or electron cyclotron resonance (ECR) or downstream plasma etching with no DC component to the plasma. Other etching processes may also be used.

Still referring to FIG. 9, using a subsequent photolithography step and evaporation, ohmic metal is formed on the exposed portions of the barrier layer 430. The ohmic metal is patterned so as to be smaller than the window in the protective layer 440, and the ohmic metal is annealed to provide the source and drain ohmic contacts 452 and 454. As such, the edges of the source and drain ohmic contacts 452 and 454 may be spaced apart from the adjacent protective layer 440.

Figure 10:
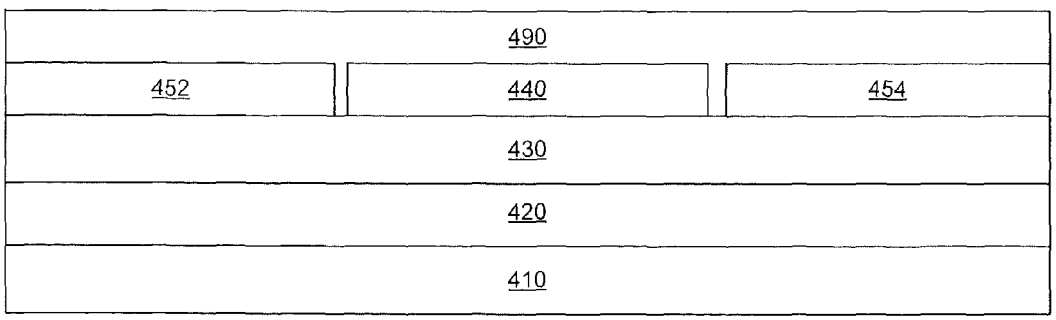

FIG. 10 illustrates the formation of a second layer 490 on the source and drain ohmic contacts 452 and 454 and the protective layer 440. The second layer 490 may be a dielectric layer having a lower dielectric index than the protective layer 440. The second layer 490 may also be a sacrificial layer, which may be removed in a subsequent step. For example, the second layer 490 may be a photoresist layer. Also, the second layer 490 may be a polymide layer.

Figure 11:
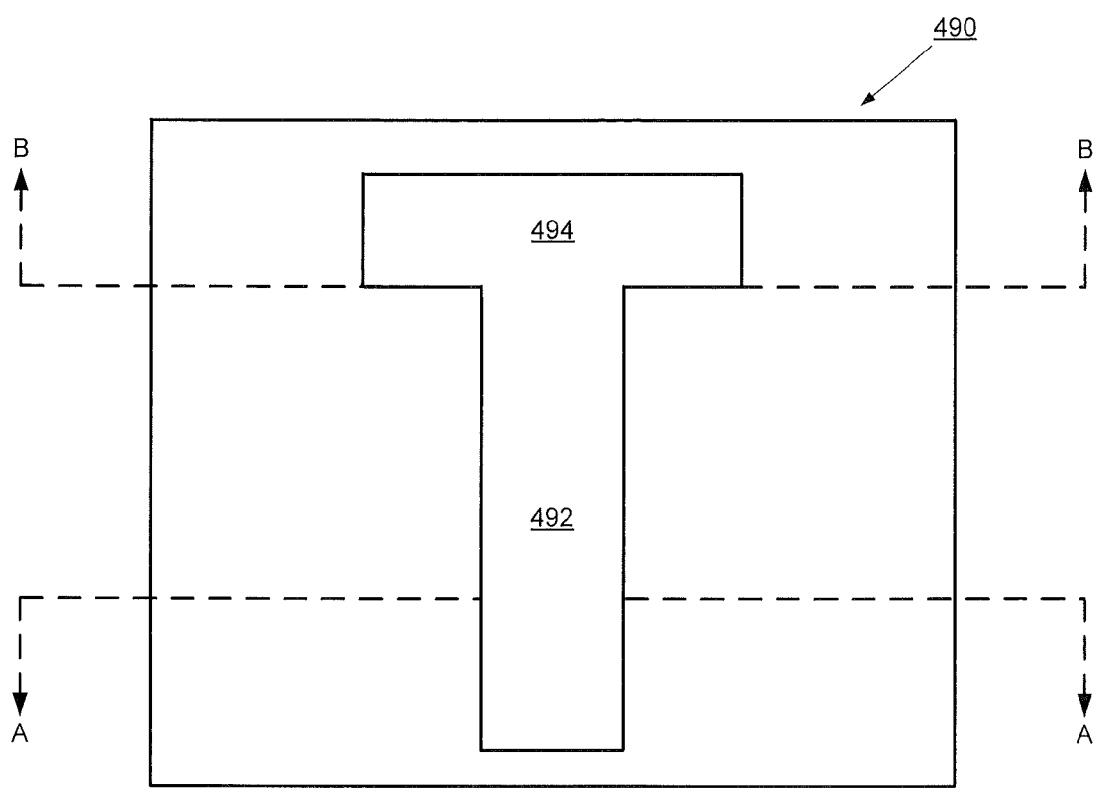
FIGS. 11, 14, 16, and 18-21 are plan views illustrating exemplary intermediate fabrication steps in operations for fabricating wide bandgap semiconductor devices according to some embodiments of the present invention.
Figure 12:
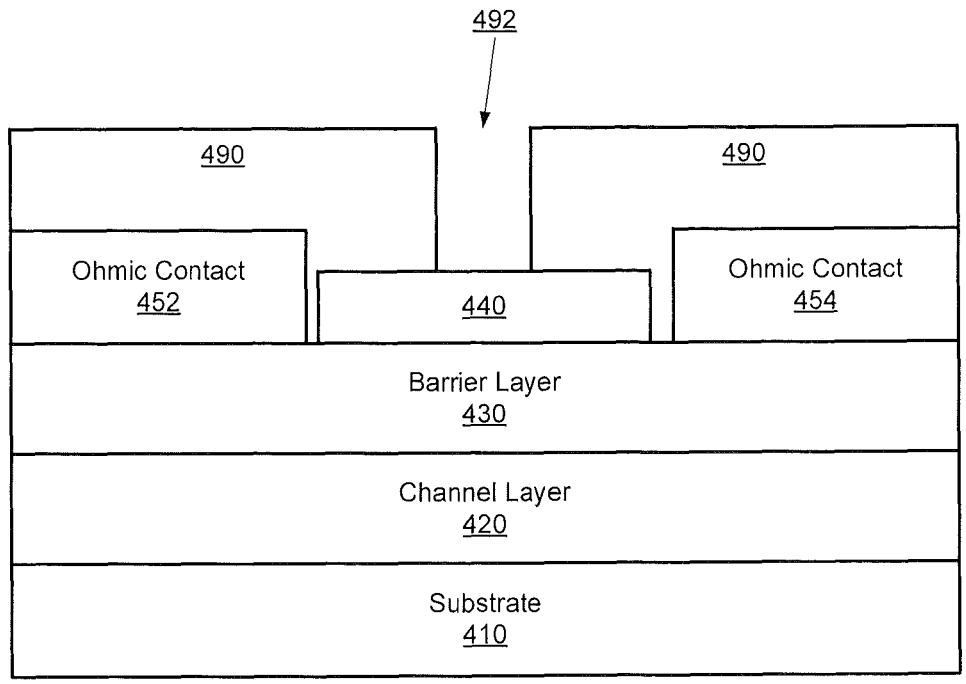
Figure 13:
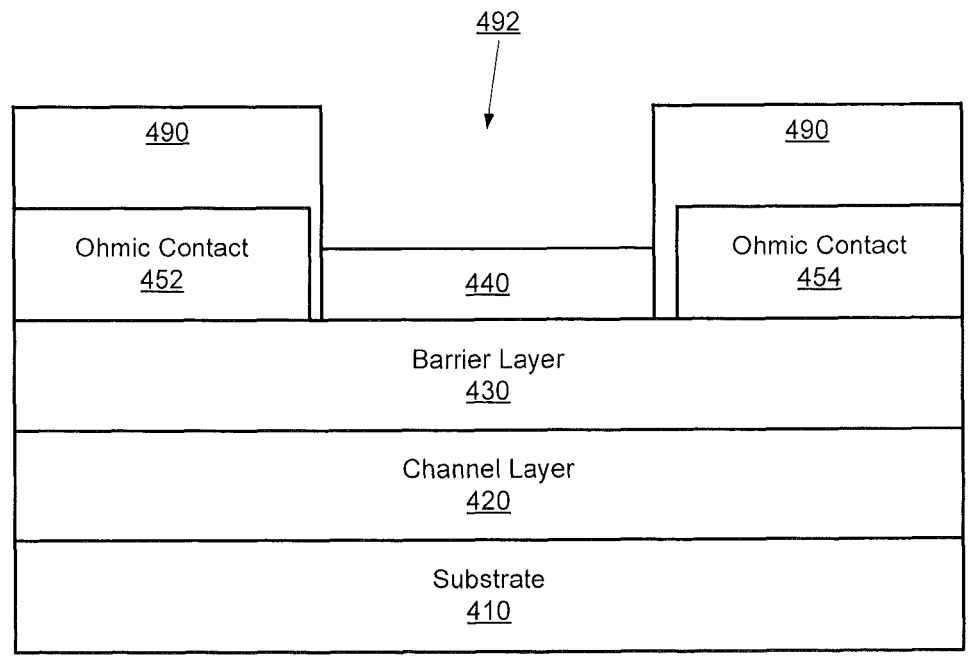

FIGS. 11-16, illustrate the formation of openings or "windows" 492, 494, 496, and 498 in the second layer 490. As shown in FIGS. 11-13, first and second openings 492 and 494 are formed that extend through the second layer 490 and expose a portion of the protective layer 440. For example, the second layer 490 may be photolithographically patterned to form the windows 492 and 494. FIG. 12 is a sectional view taken along the line A-A of FIG. 11. FIG. 13 is a sectional view taken along the lone B-B of FIG. 11.

Figure 14:
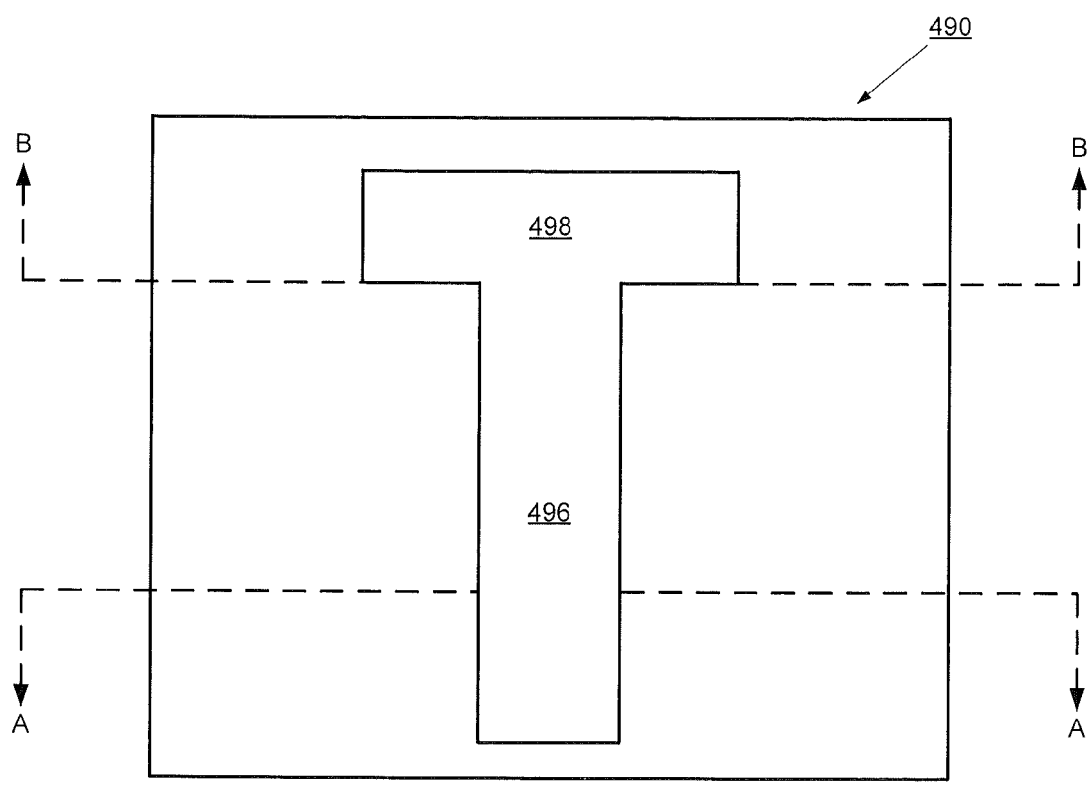
Figure 15:
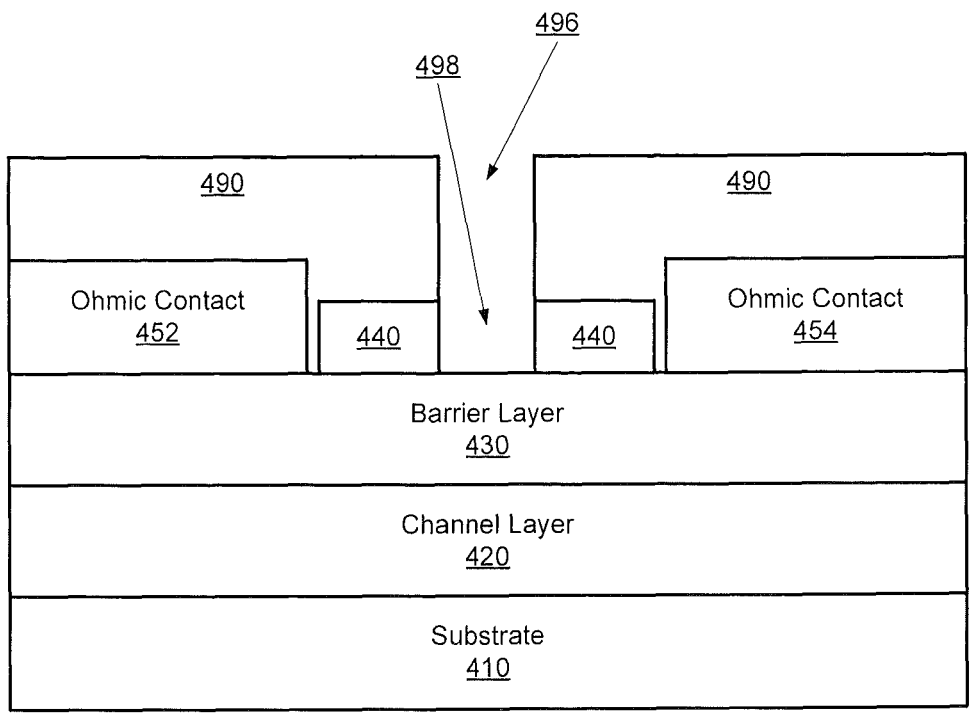
Figure 16:
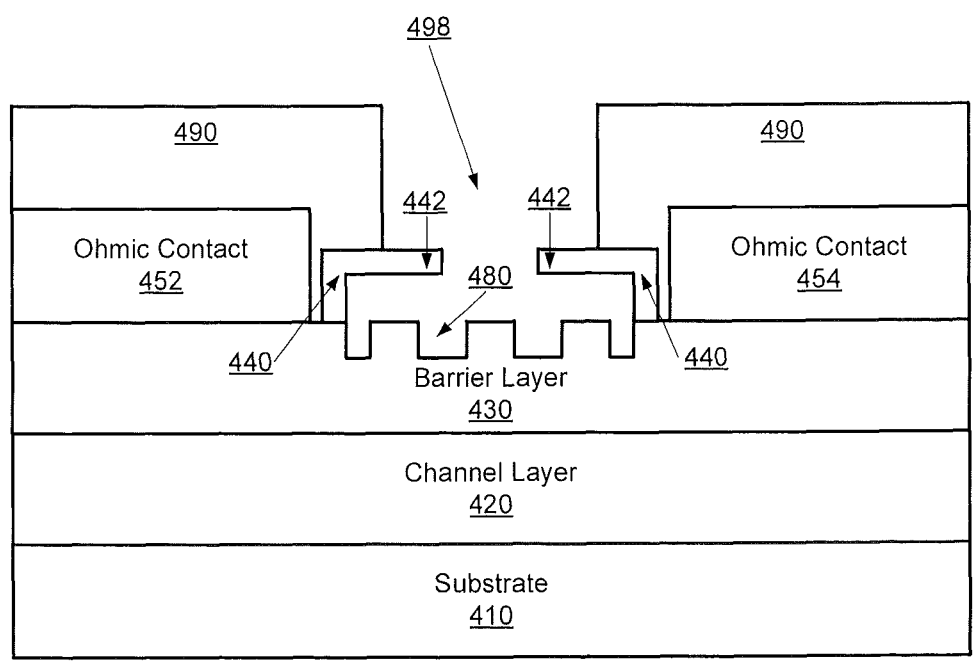

FIGS. 14-16 illustrate the formation of the windows 496 and 498 in the protective layer 440 where the gate electrode 460 and the gate contact 462 may be formed in a subsequent step according to various embodiments. As shown in FIG. 14, first and second openings 496 and 498 are formed that extend through the protective layer 440 to expose a portion of the barrier layer 430. FIG. 15 is a sectional view taken along the line A-A of FIG. 14. FIG. 16 is a sectional view taken along the line B-B of FIG. 14. More particularly, the exposed portion of the protective layer 440 is patterned using the second layer 490 as a mask to form the first opening 496. The first opening 496 may be formed by selectively etching the portion of the protective layer 440 exposed by the first opening 492 in the second layer 490 using a low damage etch technique, as described above, to facilitate the formation of a low-leakage Schottky gate electrode on the exposed surface of the barrier layer 430. Note that the first opening 496 in the protective layer 440 may be wider or narrower than the first opening 492 in the second layer 490, due to overcutting or undercutting of the etch.

Still referring to FIGS. 14-16, a second opening 498 is formed extending through the protective layer 440 to expose a portion of the barrier layer 430. More particularly, the exposed portion of the protective layer 440 is patterned using the second layer 490 as a mask to form the second opening 498. The second opening 498 may be formed by selectively etching the portion of the protective layer 440 exposed by the second opening 494 in the second layer 490 using a low damage etch technique, as described above. Note the second opening 498 in the protective layer 440 may be wider or narrower than the second opening 494 in the second layer 490, due to overcutting or undercutting of the etch. As shown, for example in FIG. 16, the second opening 498 in the protective layer 440 also may be undercut to form flanges 442 in the protective layer 440 that laterally extend inside the opening 498. As used herein the term "laterally" refers to a direction that is substantially parallel with respect to the surface of the barrier layer 430. The openings 496 and 498 may be formed in a single processing step.

Referring to FIG. 16, the exposed portion of the barrier layer 430 is patterned to form a plurality of recesses 480 in the barrier layer 430. More particularly, the plurality of recesses 480 may be formed by forming a photolithography mask (not shown) on the barrier layer 430. The portions of the barrier layer 430 that are exposed by the photolithography mask are etched to form the plurality of recesses 480 in the barrier layer 430. After the plurality of recesses 480 are formed, the photolithography mask is removed. The plurality of recesses 480 in the barrier layer 430 may be formed by selectively etching the exposed portion of the barrier layer 430 using conventional methods such as chemical or ion mill etching. In other embodiments, the plurality of recesses 480 may be formed by surface roughening. For example, using use of very dilute wet chemical etches during the recess etch can lead to rough surfaces. An alternate method is selecting dry etch conditions that create micromasking; such as etching at low temperatures.

Figure 17:
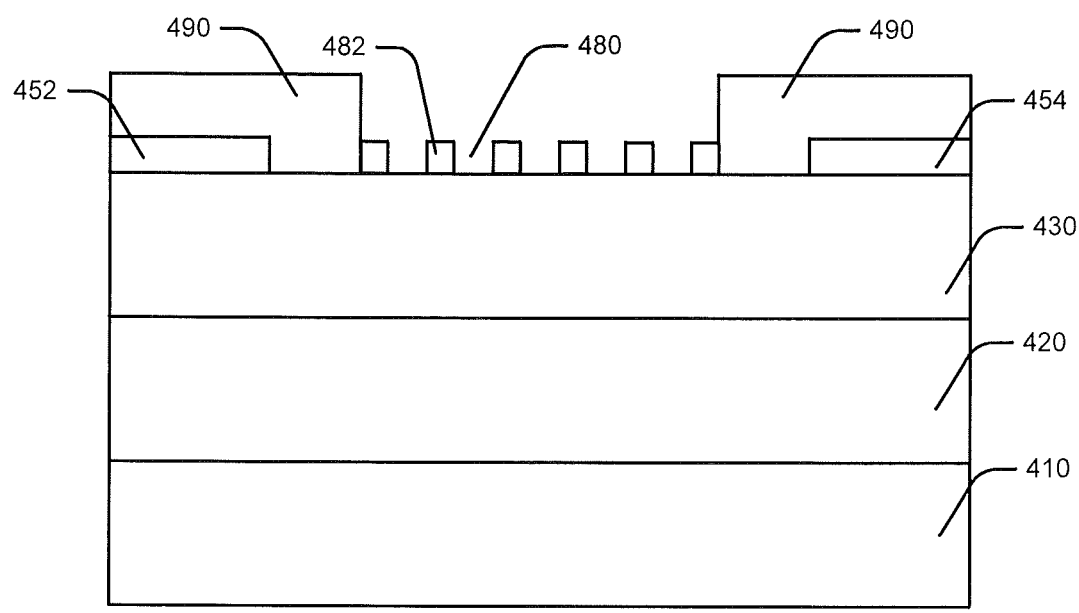

In an alternative embodiment, as illustrated in FIG. 17, the plurality of recesses 480 may be formed by forming a plurality of spacers 482 on the barrier layer 430. More particularly, the plurality of spacers 482 may be formed by selectively etching the portion of the protective layer 440 exposed by the opening 498 in the second layer 490 using conventional methods such as chemical or ion mill etching such that remaining portions of the protective layer 440 form the spacers 482. The plurality of recesses 480 are provided between the plurality of spacers 482 on the barrier layer 430.

Figure 18:
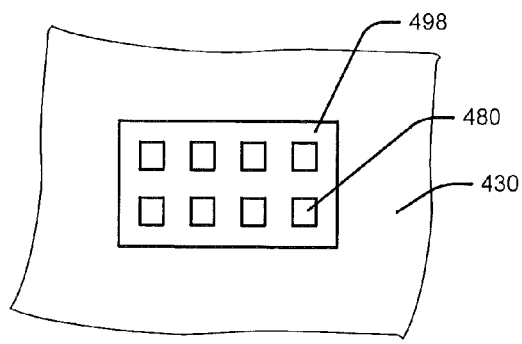
Figure 19:
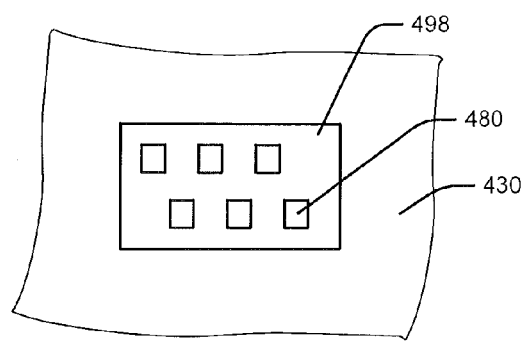
Figure 20:
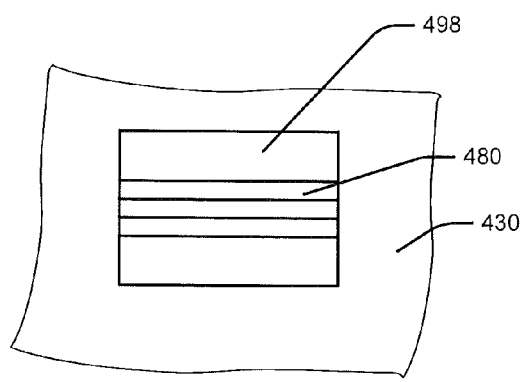
Figure 21:
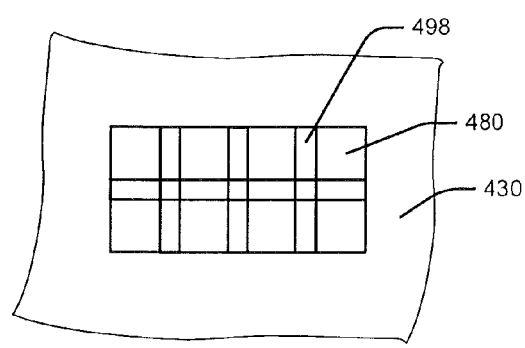

The plurality of recesses 480 in or on barrier layer 430 can take many different shapes, sizes and patterns. For example, FIGS. 18-21 each show a plan view of exemplary embodiments of the plurality of recesses 480 formed in or on the barrier layer 430. The plurality of recesses 480 may have circular, square, rectangular or other shapes. The plurality of recesses 480 may be arranged in a two-dimensional array as shown in FIG. 18, offset rows and columns as shown in FIG. 19, ridges and grooves as shown in FIG. 20, a "waffle" pattern as shown in FIG. 21 or other patterns.

Figure 22:
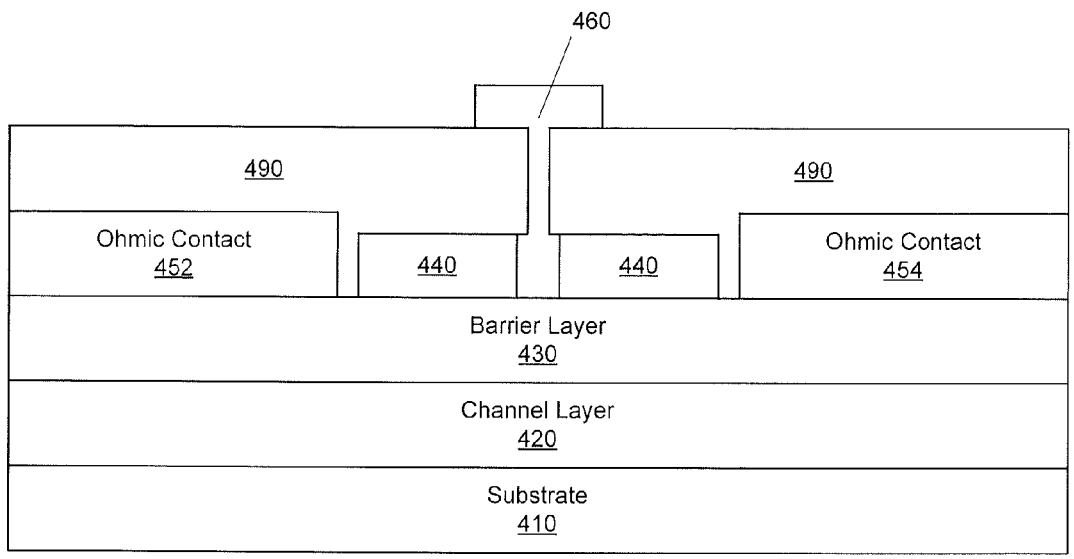
Figure 23:
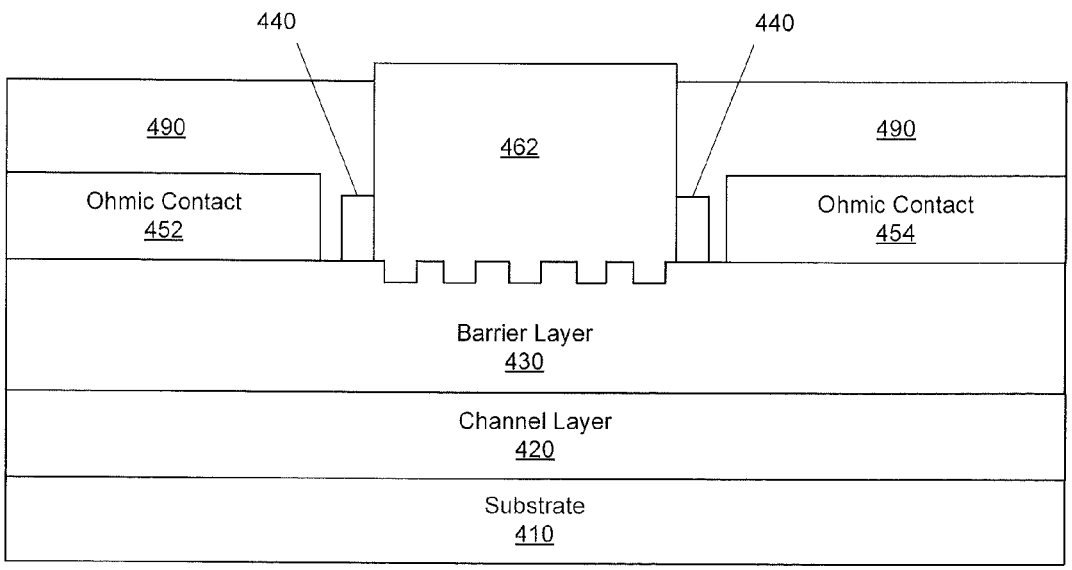

FIGS. 22 and 23 illustrate the formation of a gate electrode 460 and a gate contact 462. Referring to FIGS. 22 and 23, using photolithography and evaporation, metal is formed on the exposed portions of the barrier layer 430 to form the gate electrode 460 and the gate contact 462. More particularly, the gate electrode 460 and the gate contact 462 are formed by depositing evaporated metal in the windows 496 and 498. As such, the gate electrode 460 and the gate contact 462 extend through the protective layer 440 to contact the exposed portions of the barrier layer 430 in the opening 496 and the plurality of recesses 480 on or in the barrier layer 430 in the opening 498. Using evaporation to form the gate electrode 460 and the gate contact 462 may provide worse adhesion between the metal in the gate and the barrier layer 430 than adhesion if a sputtering step were used to form the gate electrode 460 and the gate contact 462. However, use of evaporation results in less damage to the barrier layer 430 than would occur with use of sputtering. Suitable gate electrode and gate contact materials may depend on the composition of the barrier layer 430. However, in certain embodiments, conventional materials capable of making a Schottky electrode to a GaN-based wide bandgap semiconductor material may be used, such as Ni, Pt, and/or Ir. When high work function metals, such as Pt and/or Ir, are used as the barrier metal layer 470 for a GaN-based wide bandgap semiconductor device, for example, the diffusion barrier metal layer 472 may be omitted from the gate contact 462.

Figure 24:
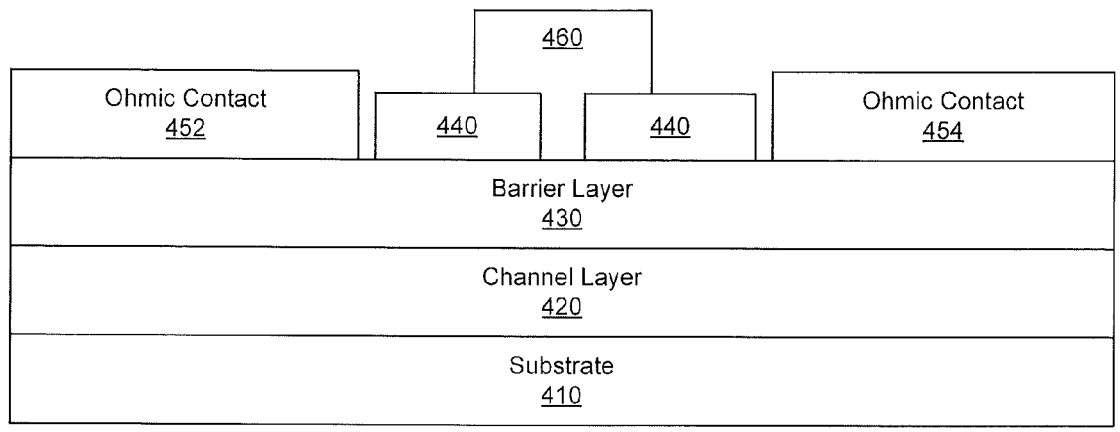
Figure 25:
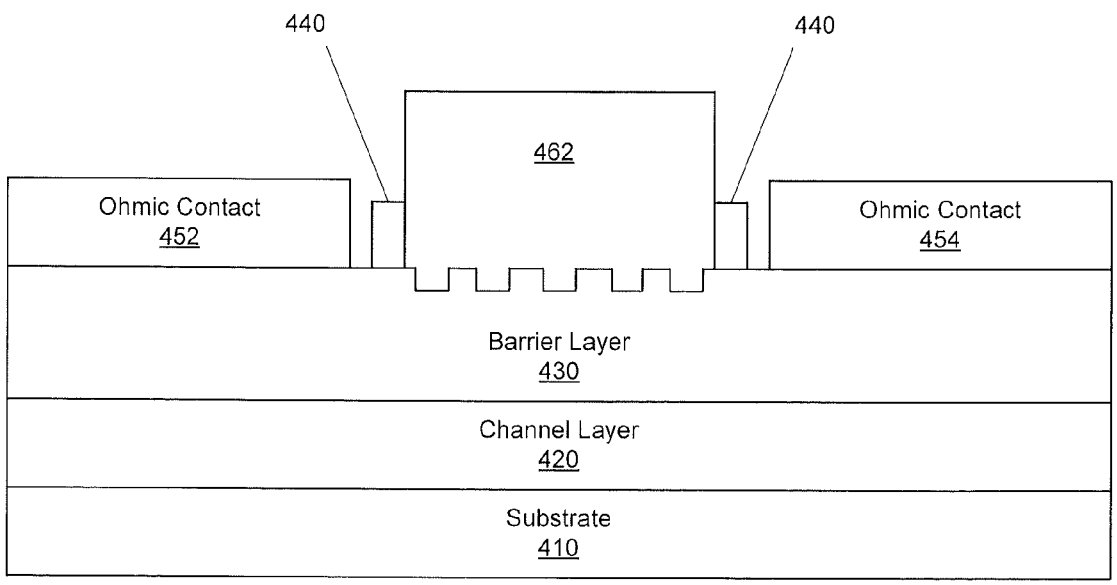

FIGS. 24-25 illustrate removal of the sacrificial second layer 490. As shown in FIGS. 24-25, the second layer 490 is removed after the gate electrode 460 and gate contact 462 are formed. The second layer 490 may be removed using conventional techniques, depending on the composition of the second layer 490.

Various embodiments described herein may increase adhesion between a barrier metal layer of a gate contact and a top surface of a wide bandgap semiconductor layer by including a plurality of recesses in or on the wide bandgap semiconductor layer. Additionally, including flanges laterally extending into the opening in which the metal gate contact is formed may further prevent or decrease loss of the metal gate contact because the flanges help to "lock" the metal in place. Increased adhesion may prevent or decrease the loss of gate contacts in subsequent fabrication steps and/or use of the wide bandgap semiconductor device. Increased adhesion permits use of high function metals, such as Pt and/or Ir, as the barrier metal layer. Additionally, use of such high work function metals may permit omission of a diffusion barrier metal layer in a gate electrode and a gate contact. Moreover, use of such high work function metals may increase the electrical properties of the gate electrode such as, for example, a decrease in leakage current of the gate electrode. Improved metal contacts for wide bandgap semiconductor devices may thereby be provided.

Many different embodiments have been disclosed herein, in connection with the above description and drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the inventions being set forth in the following claims.

What is claimed is:

1. A wide bandgap semiconductor device comprising:
    a wide bandgap semiconductor channel layer having a planar top surface;
    a wide bandgap semiconductor layer having a top surface, the wide bandgap semiconductor layer on the planar top surface of the wide bandgap semiconductor channel layer;
    a plurality of recesses in the top surface of the wide bandgap semiconductor layer; and
    a metal gate contact within the recesses and on portions of the top surface of the wide bandgap semiconductor layer that are between the recesses,
    a source region;
    a drain region;
    a metal gate electrode on the wide bandgap semiconductor layer between the source and drain regions,
    wherein the metal gate contact is connected to the metal gate electrode,
    wherein the source and drain regions and the metal gate electrode are configured to provide a HEMT, FET or Schottky device,
    wherein the metal gate electrode, the source region and the drain region extend in a first direction on the wide bandgap semiconductor layer, and the metal gate contact is wider than the metal gate electrode along an axis that is perpendicular to the first direction, and
    wherein a lower surface of the metal gate contact includes a plurality of protrusions along the axis that is perpendicular to the first direction, the protrusions directly contacting the underlying wide bandgap semiconductor layer.

2. A device according to claim 1 further comprising:
    a protective layer on the wide bandgap semiconductor layer;
    a first opening extending through the protective layer;
    a dielectric layer on the protective layer, the dielectric layer having a second opening extending therethrough that is narrower than the first opening; and
    wherein the metal gate contact is in the first and second openings.

3. A device according to claim 2, wherein the protective layer has flanges laterally extending into the first opening.

4. A device according to claim 1, wherein the wide bandgap semiconductor layer has a first bandgap that is higher than a second bandgap of the wide bandgap semiconductor channel layer.

5. A device according to claim 4, wherein the metal gate contact includes:
    a high work function barrier metal layer directly on the wide bandgap semiconductor layer; and
    a current spreading layer directly on the high work function barrier metal layer that is remote from the wide bandgap semiconductor layer.

6. A device according to claim 5, wherein the wide bandgap semiconductor layer comprises gallium nitride, the high work function barrier metal layer comprises platinum, iridium and/or nickel, and the current spreading layer comprises gold.

7. A device according to claim 6, wherein the plurality of recesses comprise a plurality of rows of holes in the top surface of the wide bandgap semiconductor layer that are arranged in a two-dimensional array.

8. A device according to claim 6, wherein the plurality of recesses are arranged in at least a first row and at least a second row, wherein the recesses of the first row are offset in at least two directions from the recesses of the second row.

9. A device according to claim 6, wherein the plurality of recesses form at least two grooves, the at least two grooves defining a ridge between the at least two grooves.

10. A device according to claim 6, wherein the plurality of recesses are arranged in a random pattern.

11. A device according to claim 6, wherein the metal gate electrode comprises an elongated metal gate electrode that has a width and a length that exceeds the width, and wherein a width of the metal gate contact exceeds the width of the elongated metal gate electrode.

12. A device according to claim 5, wherein the wide bandgap semiconductor layer comprises silicon carbide, the high work function barrier metal layer comprises platinum, gold or iridium, and the current spreading layer comprises gold.

13. A semiconductor device comprising:
    a substrate;
    a wide bandgap semiconductor layer on the substrate, the wide bandgap semiconductor layer having a source region, a drain region and a top surface;
    a metal gate electrode on the top surface of the wide bandgap semiconductor layer between the source and drain regions, the metal gate electrode having a first end and an opposing end; and a metal gate contact connected to the opposing end of the metal gate electrode on the top surface of the wide bandgap semiconductor layer, wherein a plurality of recesses are provided in the top surface of the wide band gap semiconductor layer, and wherein the metal gate contact is within the recesses and directly on portions of the top surface of the wide bandgap semiconductor layer that are between the recesses, wherein the plurality of recesses comprise a plurality of rows of holes in the top surface of the wide bandgap semiconductor layer wherein the rows of holes extend in two different directions to provide a two-dimensional array of holes.

14. A device according to claim 13 further comprising:
a protective layer on the wide bandgap semiconductor layer;
a first opening extending through the protective layer;
a dielectric layer on the protective layer, the dielectric layer having a second opening extending therethrough that is narrower than the first opening; and
wherein the metal gate contact is in the first and second openings.

15. A device according to claim 14, wherein the protective layer has flanges laterally extending into the first opening.

16. A device according to claim 13, wherein the metal gate contact comprises:
a barrier metal layer that directly contacts the wide bandgap semiconductor layer; and
a current spreading layer directly on the barrier metal layer opposite the wide bandgap semiconductor layer.

17. A device according to claim 16, wherein the barrier metal layer is configured to prevent a substantial increase in leakage current of the metal gate electrode.

18. A device according to claim 16, wherein the wide bandgap semiconductor layer comprises gallium nitride, the barrier metal layer comprises platinum, iridium and/or nickel, and the current spreading layer comprises gold.

19. A device according to claim 18, wherein the plurality of recesses are arranged in at least a first row and at least a second row, wherein the recesses of the first row are offset in at least two directions from the recesses of the second row.

20. A device according to claim 18, wherein the plurality of recesses form at least two grooves, the at least two grooves defining a ridge between the at least two grooves.

21. A device according to claim 18, wherein the plurality of recesses are arranged in a random pattern.

22. A device according to claim 18, wherein the recesses do not extend all the way through the wide bandgap semiconductor layer to a bottom surface of the wide bandgap semiconductor layer.

23. A device according to claim 18, wherein the metal gate contact is directly on the wide bandgap semiconductor layer.

24. A device according to claim 18, wherein a first portion of the wide bandgap semiconductor layer that is underneath the source region and a second portion of the wide bandgap semiconductor layer that is underneath the drain region do not include any recesses.

25. A device according to claim 16, wherein the wide bandgap semiconductor layer comprises silicon carbide, the barrier metal layer comprises platinum, gold or iridium, and the current spreading layer comprises gold.

26. A semiconductor device comprising:
a wide bandgap semiconductor layer;
a metal gate structure on the wide bandgap semiconductor layer, the metal gate structure including a metal gate electrode and a metal gate contact that is connected to an end of the metal gate electrode, the metal gate contact having a maximum width that exceeds a maximum width of the metal gate electrode,
a source contact; and
a drain contact,
wherein the metal gate structure comprises a barrier metal layer on the wide bandgap semiconductor layer configured to prevent a substantial increase in leakage current of the metal gate electrode, and a current spreading layer on the barrier metal layer that is remote from the wide bandgap semiconductor layer,
wherein at least part of the metal gate electrode is disposed in a first region that is between the source contact and the drain contact, while at least part of the metal gate contact is outside the first region, and
wherein a bottom surface of the metal gate contact includes a plurality of protrusions, and
wherein a bottom surface of the metal gate electrode is planar.

27. A device according to claim 26, further comprising a protective layer on the wide bandgap semiconductor layer, wherein the protective layer under the metal gate contact comprises a plurality of spacers that are arranged in a two-dimensional array that define a plurality of recesses therebetween.

28. A device according to claim 26, wherein the metal gate contact is directly on the wide bandgap semiconductor layer.

29. A wide bandgap gallium nitride based high electron mobility transistor comprising:
a substrate;
a wide bandgap gallium nitride based semiconductor channel layer on the substrate;
a wide bandgap semiconductor layer on the wide bandgap gallium nitride based semiconductor channel layer;
a protective layer on the wide bandgap semiconductor layer; and
a metal gate electrode, a source contact, a drain contact and a metal gate contact on the wide bandgap semiconductor layer, wherein the metal gate electrode extends in a first direction and the metal gate contact is positioned at a first end of the metal gate electrode and extends in a second direction that is different from the first direction,
wherein a lower surface of the metal gate contact includes a plurality of protrusions that directly contact the underlying wide bandgap semiconductor layer and regions between the protrusions that also directly contact the underlying wide bandgap semiconductor layer,
wherein the wide bandgap semiconductor layer consists of a doped wide bandgap semiconductor layer that includes a plurality of recesses in a top surface thereof under the metal gate contact, and wherein the plurality of recesses do not extend all of the way through the doped wide bandgap semiconductor layer to a bottom surface of the doped wide bandgap semiconductor layer, and
wherein a top surface of the wide bandgap semiconductor layer is planar under the metal gate electrode.

30. The wide bandgap gallium nitride based high electron mobility transistor of claim 29, wherein the one or more protrusions extending from the lower surface of the metal contact extend into respective ones of the one or more recesses in the top surface of the wide bandgap semiconductor layer.

31. The wide bandgap gallium nitride based high electron mobility transistor according to claim 30, wherein the one or more recesses included in the top surface of the wide bandgap semiconductor layer comprises a two-dimensional array of recesses.

32. The wide bandgap gallium nitride based high electron mobility transistor according to claim 29, wherein the metal contact includes:
- a high work function barrier metal layer directly on the wide bandgap seminconductor layer; and
- a current spreading layer directly on the barrier metal layer opposite the wide bandgap semiconductor layer.

33. The wide bandgap gallium nitride based high electron mobility transistor according to claim 32, wherein the wide bandgap semiconductor layer comprises aluminum gallium nitride, the high work function barrier metal layer comprises platinum, iridium or nickel, and the current spreading layer comprises gold.

34. The wide bandgap gallium nitride based high electron mobility transistor according to claim 29, wherein the metal gate contact is directly on the wide bandgap semiconductor layer.

* * * * *